(12) United States Patent
Choe et al.

(10) Patent No.: US 10,436,824 B2
(45) Date of Patent: Oct. 8, 2019

(54) ENERGY MEASURING AND LABELING APPARATUS AT POWER PENETRATION POINT

(71) Applicant: ENCORED TECHNOLOGIES, INC., Seoul (KR)

(72) Inventors: Jong-Woong Choe, Seoul (KR); Hyunsu Bae, Seoul (KR)

(73) Assignee: Encored Technologies, Inc., Seoul (KR)

( * ) Notice: Subject to any disclaimer, the term of this patent is extended or adjusted under 35 U.S.C. 154(b) by 1061 days.

(21) Appl. No.: 14/526,916

(22) Filed: Oct. 29, 2014

(65) Prior Publication Data

US 2015/0233984 A1 Aug. 20, 2015

(30) Foreign Application Priority Data

Feb. 18, 2014 (KR) ........................ 10-2014-0018391

(51) Int. Cl.
*G01R 21/133* (2006.01)
*H02J 3/14* (2006.01)
*H02J 7/00* (2006.01)

(52) U.S. Cl.
CPC .............. *G01R 21/133* (2013.01); *H02J 3/14* (2013.01); *H02J 2003/143* (2013.01); *H02J 2007/005* (2013.01); *Y02B 70/3225* (2013.01); *Y02B 70/3266* (2013.01); *Y04S 20/222* (2013.01); *Y04S 20/242* (2013.01)

(58) Field of Classification Search
CPC .................................................. G01R 21/133
See application file for complete search history.

(56) References Cited

U.S. PATENT DOCUMENTS

| | | | | |
|---|---|---|---|---|
| 8,588,991 B1* | 11/2013 | Forbes, Jr. | ............. | G05B 19/02 700/295 |
| 2012/0331478 A1* | 12/2012 | Zhu | ................... | H04W 72/0486 718/104 |
| 2014/0068221 A1* | 3/2014 | Feng | ..................... | G06F 12/023 711/170 |
| 2015/0355247 A1* | 12/2015 | Choe | .................... | G01R 21/133 702/60 |

FOREIGN PATENT DOCUMENTS

JP 2009257952 11/2009
KR 1020130081226 7/2013

* cited by examiner

*Primary Examiner* — Manuel A Rivera Vargas
(74) *Attorney, Agent, or Firm* — John H. Choi & Associates

(57) ABSTRACT

Accordingly, the embodiments herein provide an energy measurement information labeling system at a power penetration point. The energy measurement information labeling system includes an energy measuring apparatus configured to collect power information including a power signal, at the power penetration point, for a plurality of load apparatuses. Further, the energy measuring apparatus is configured to generate and transmit a data set for each of the load apparatus which matches one of an operating status and a change pattern of operating status of each the load apparatus through a signal correlation depending on power usage features of the individual load apparatuses. Further, the energy measurement information labeling system includes a power information labeling server configured to receive the data set, and reclassify the data set according to the operating characteristics of each of the load apparatuses.

5 Claims, 6 Drawing Sheets

— 1 —
ENERGY MEASURING AND LABELING APPARATUS AT POWER PENETRATION POINT

TECHNICAL FIELD

The present invention relates to an energy measuring and labeling system. More particularly related to a mechanism for individually measuring and labeling energy usage information of a plurality of load apparatus connected to a power penetration point.

BACKGROUND

An energy measuring apparatus, through an Advanced Metering Infrastructure (AMI), Automatic Meter Reading (AMR), a digital power meter, or the like in the prior arts, measures only total power usage information generated by a combination of individual load apparatuses. In order to extract energy usage information of each load apparatus, either multiple energy measuring apparatuses are to be installed or a single energy measuring apparatus with multiple sensors needs to be installed in a distribution board. When an energy measuring apparatus is installed for each load apparatus, it requires more installation space thereby increasing the overall system cost. When the multiple sensors are used in the distribution board, the overall system cost increases based on adoption of the multiple sensors. Moreover, there will be a limit in acquiring the energy usage information for each of the load apparatuses.

In order to solve the above problems, various mechanisms to efficiently extract the energy usage information of each load apparatuses at a power penetration point are proposed. In one mechanism, a scheme is represented to extract the energy usage information of each of the load apparatuses through a series of computer operations performed for measuring signal information such as current, voltage, power, and the like. The measured signal information of each of the load apparatuses is then directly transmitted to a specific server. However, it is important to develop an energy measuring apparatus that can perform previous signal information processing to flexibly process, store, and manage massive data of the server. The previous signal information processing is associated with signal information sampling and clustering of a specific data set (for example, data corresponding to same load apparatus). In this case, the processed information needs to maintain resolution at a level to be distinguished for each of the individual load apparatuses while the server computer operates.

Thus, there remains a need of a robust system and method for individually measuring and labeling energy usage information of a plurality of load apparatus connected to a power penetration point.

SUMMARY OF INVENTION

The present invention proposes an energy measuring apparatus to measure energy usage information by using only a single sensor such as a hall sensor at a specific point (primarily, a power penetration point of a panel board or a distribution board) where multiple load apparatuses using electric energy in a building, household, shop, farm area, etc. are combined.

Accordingly, the embodiments herein provide an energy measurement apparatus at a power penetration point. The energy measuring apparatus includes a power information collecting unit configured to collect power information. The power information includes a power signal at the power penetration point for a plurality of load apparatuses. Further, the energy measuring apparatus includes an operating status extracting unit configured to distinguish one of a normal and excessive status of a power change from the power information to extract one of an operating status and a change pattern of operating status of the plurality of load apparatuses. Further, the energy measuring apparatus includes a data set generating unit configured to generate a data set for each of the individual load apparatus which matches one of the operating statuses and the change pattern of operating status, wherein the data set is generated through a signal correlation based on power usage information of the individual load apparatuses.

In an embodiment, the power information collecting unit is configured to collect one of a voltage snapshot and a current snapshot of an AC waveform having a predetermined cycle as the power information.

In an embodiment, the operating status extracting unit is configured to classify one of the voltage snapshot and the current snapshot according to one of the extracted operating statuses and the extracted change pattern of operating status.

In an embodiment, the signal correlation includes information associated with at least one of a voltage correlation, a current correlation, a high-frequency distortion, a current snapshot signal deformation, a power snapshot signal deformation, an active power correlation from a power usage feature of the load apparatus, and a reactive power correlation from a power usage feature of the load apparatus.

In an embodiment, the data generating unit is configured to generate a data set for each load apparatus that corresponding to the same energy apparatus or the same component apparatus constituting the same energy apparatus.

In an embodiment, the energy measuring apparatus includes a transmitting unit configured to transmit the data set to a labeling server that generates labeled power information by recombining the data set.

Accordingly, the embodiments herein provide an energy measurement information labeling server which includes a receiving unit configured to receive a data set by classifying power information based on individual load apparatuses. Further, the energy measurement information labeling server includes a recombination unit configured to reclassify the data set according to operating characteristics of the individual load apparatuses. Further, the recombination unit is configured to map and recombine the reclassified data set according to a time domain. Furthermore, the energy measurement information labeling server includes a labeling unit configured to label the recombined data set.

In an embodiment, the recombination unit maps the reclassified data set to a power consumption change of the time domain to distinguish the reclassified data set as a data set for each component of the individual load apparatuses, wherein the recombination unit recombines the component according to a property of the individual load apparatuses.

In an embodiment, the energy measurement information labeling server is configured to sense a change of the data set through a result distinguished as the data set for each of the components of the individual load apparatuses to determine statuses of the individual load apparatuses.

Accordingly, the embodiments herein provide an energy measurement information labeling system. The energy measurement information labeling system includes an energy measuring apparatus configured to collect power information including a power signal, at the power penetration point, for a plurality of load apparatuses. Further, the energy measuring apparatus is configured to generate and transmit a data set for each of the load apparatus which matches one of an operating status and a change pattern of operating status of each of the load apparatus through a signal correlation depending on power usage features of the individual load apparatuses. Further, the energy measurement information labeling system includes a power information labeling server configured to receive the data set, and reclassify the data set according to the operating characteristics of each of the load apparatuses.

Further, the power information labeling server is configured to map and recombine the data set according to a time domain, and label the recombined data set.

In an embodiment, the power information labeling server is configured to sense a change of the data set through a result distinguished as the data set for each component of each load apparatus to determine statuses of each load apparatus.

Accordingly the embodiments herein provide a method for measuring power information by an energy measuring apparatus at a power penetration point. The method includes collecting power information having a power signal at the power penetration point for a plurality of load apparatuses. Further, the method includes distinguishing one of a normal and excessive status of a power change from the power information to extract one of an operating status and a change pattern of operating status of the plurality of load apparatuses. Furthermore, the method includes generating a data set for each individual load apparatus which matches one of the operating status and the change pattern of operating status, wherein the data set is generated through a signal correlation based on power usage information of the individual load apparatuses. Furthermore, the method includes transmitting the data set to a labeling server that generates labeled power information by recombining the data set.

Accordingly the embodiments herein provide a method for labeling energy information by an energy measurement information labeling server. The method includes receiving a data set by classifying power information based on individual load apparatuses, and reclassifying the data set according to operating characteristics of the individual load apparatuses. Further, the method includes mapping and recombining the reclassified data set according to a time domain; and labeling the recombined data set.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE FIGURES

This invention is illustrated in the accompanying drawings, throughout which like reference letters indicate corresponding parts in the various figures. The embodiments herein will be better understood from the following description with reference to the drawings, in which.

DETAILED DESCRIPTION OF INVENTION

Figure 1:
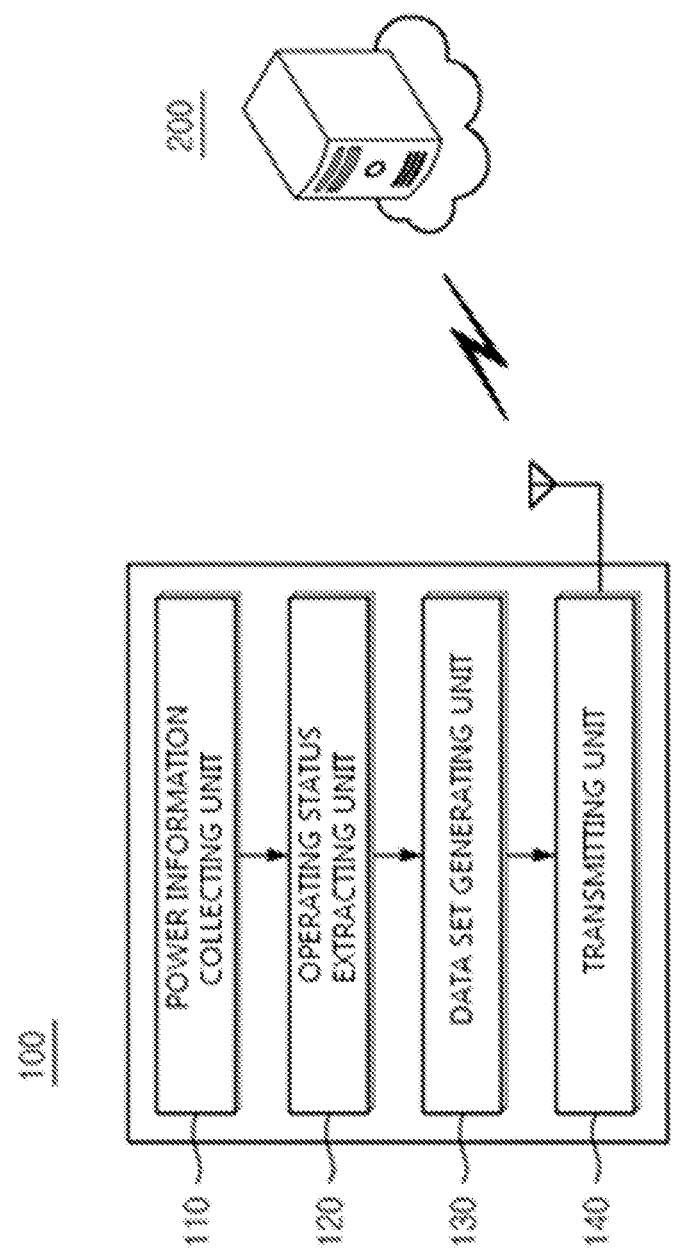
FIG. 1 is a block diagram illustrating an energy measuring apparatus at a power penetration point, according to the embodiments as described herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

The embodiments herein provide an energy measuring apparatus at a power penetration point. The energy measuring apparatus includes a power information collecting unit configured to collect power information. The power information includes a power signal at the power penetration point for a plurality of load apparatuses. Further, the energy measuring apparatus includes an operating status extracting unit configured to distinguish one of a normal and excessive status of a power change from the power information to extract one of an operating status and a change pattern of operating status of the plurality of load apparatuses. Further, the energy measuring apparatus includes a data set generating unit configured to generate a data set for each individual load apparatus which matches one of the operating statuses and the change pattern of operating status, wherein the data set is generated through a signal correlation based on power usage information of the individual load apparatuses.

In another embodiment, an energy measurement information labeling server is proposed. The energy measurement information labeling server includes a receiving unit configured to receive a data set by classifying power information based on individual load apparatuses. Further, the energy measurement information labeling server includes a recombination unit configured to reclassify the data set according to operating characteristics of the individual load apparatuses. Further, the recombination unit is configured to map and recombine the reclassified data set according to a time domain. Furthermore, the energy measurement information labeling server includes a labeling unit configured to label the recombined data set.

In yet another embodiment, an energy measurement information labeling system is proposed. The energy measurement information labeling system includes an energy measuring apparatus configured to collect power information including a power signal, at the power penetration point, for a plurality of load apparatuses. Further, the energy measuring apparatus is configured to generate and transmit a data set for each load apparatus which matches one of an operating status and a change pattern of operating status of each load apparatus through a signal correlation depending on power usage features of the individual load apparatuses. Further, the energy measurement information labeling system includes a power information labeling server configured to receive the data set, and reclassify the data set according to the operating characteristics of each load apparatuses.

A simple robust mechanism for individually measuring and labeling energy usage information of a plurality of load apparatus connected to a power penetration point is proposed. Unlike conventional systems and methods, the proposed system and method can be used to provide active energy saving solution to a user based on energy usage information measurement for each load apparatus connected at a power penetration point. The proposed energy measuring apparatus is capable of previously processing information. Further, an excessive time delay depending on execution of a series of operations can be prevented using the energy measuring apparatus that previously process the information. Rapid extension and actualization of a non-intrusive load monitoring energy saving solution is provided without a burden of construction of a high-price system due to installation of multiple individual load apparatus monitoring apparatuses or branch circuit measuring apparatuses.

Referring now to the drawings and more particularly to FIGS. 1 to 4 where similar reference characters denote corresponding features consistently throughout the figures, there are shown preferred embodiments.

FIG. 1 is a block diagram illustrating an energy measuring apparatus 100 at a power penetration point, according to the embodiments as described herein. In the embodiment, the energy measuring apparatus 100 can be configured to generate an unregistered load clustering data set in order to individually estimate energy consumption information of each load apparatus connected to the power penetration point and transmits the estimated energy consumption information to an energy measurement information labeling server 200.

The energy measuring apparatus 100 described herein is installed together with a single sensor at the power penetration point. The energy measuring apparatus 100 performs a series of operations to measure total electric energy consumption and estimate energy consumption of each load apparatus. Unlike the conventional systems and methods, a previous information processing process performed for each load apparatus is summarized below.

First, a snapshot is extracted from a signal of voltage or current. Noise filtering is performed by extracting a reference point. Normal or excessive statuses of the voltage, active power, reactive power, and the like are distinguished based on a corresponding result, and operating statuses. An operating status change such as an on or off event of the individual load apparatuses are extracted through the distinguished normal or excessive statuses. In addition, a final clustering data set is generated by pattern matching load classification through a voltage-current correlation, a high-frequency distortion, a current or power snapshot signal deformation, an active or reactive power correlation, and the like associated with a load feature. Further, the generated clustering data set is transmitted to the energy measurement information labeling server 200 or cloud through data compression in an unregistered status. For example, load classification mark such as 1, 2, 3 or A, B, C, and the like may not be a registered status and may not be recognized to a user.

The energy measuring apparatus 100 can include a power information collecting unit 110, an operating status extracting unit 120, a data set generating unit 130, and a transmitting unit 140.

In an embodiment, the power information collecting unit 110 can be configured to collect energy or power information including a power signal at the power penetration point for a plurality of load apparatuses. The load apparatus described herein can include energy using apparatuses or components using electric energy. In an embodiment, the load apparatus can include both the individual energy apparatus such as television, refrigerator or the like and the component unit such as motor, light, or the like. The power penetration point can be, for example, a node into which power penetrates with respect to the plurality of load apparatuses such as the power penetration point of a panel board or a distribution board of a household. Further, the various operations performed by the power information collecting unit 110 are described in detail in conjunction with the FIG. 2a.

In an embodiment, the operating status extracting unit 120 can be configured to distinguish between a normal or excessive status of a power change from the collected voltage or power information to extract an operating status or a change pattern of the operating status of the load apparatus. Further, the various operations performed by the operating status extracting unit 120 are described in detail in conjunction with the FIG. 2b.

In an embodiment, the data set generating unit 130 can be configured to generate a data set for each of the individual load apparatuses which matches the operating status or the change pattern of the operating status through a signal correlation depending on power usage information of the individual load apparatuses. The various operations performed by the data set generating unit 130 are described in detail in conjunction with the FIG. 2c.

When the data sets are generated, the transmitting unit 140 can be configured to transmit the generated data sets to the energy measurement information labeling server 200 that generates labeled power information by recombining the data sets.

The FIG. 1 illustrates a limited overview of the energy measuring apparatus 100 but, it is to be understood that other embodiments are not limited thereto. The labels provided to each unit or component is only for illustrative purpose and does not limit the scope of the invention. Further, the one or more modules can be combined or separated to perform the similar or substantially similar functionalities without departing from the scope of the invention. Furthermore, the energy measuring apparatus 100 can include various other components interacting locally or remotely along with other hardware or software components to measure energy usage information of a plurality of load apparatus connected to a power penetration point. For example, the component can be, but is not limited to, a process running in the controller or processor, an object, an executable process, a thread of execution, a program, or a computer.

Figure 2A:
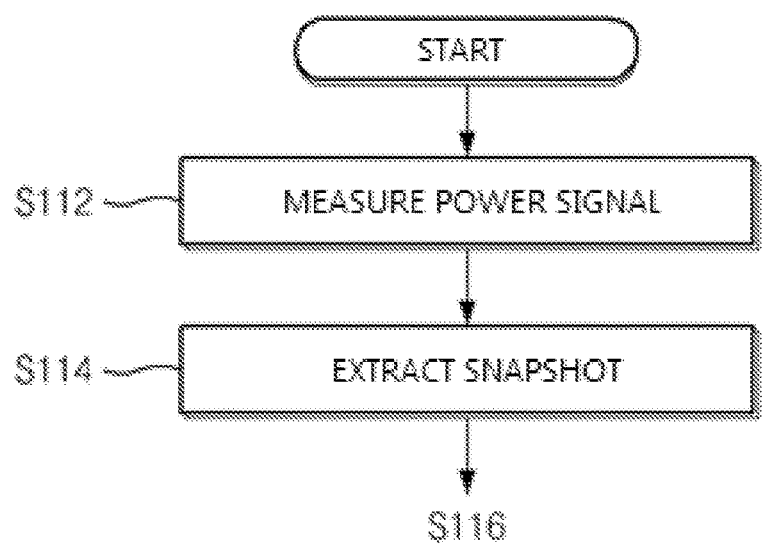
FIGS. 2a, 2b, and 2c are flowcharts illustrating various operations performed by the energy measuring apparatus at a power penetration point, according to the embodiments as described herein.

FIG. 2a is a flowchart illustrating various operations performed by the power information collecting unit 110 of the energy measuring apparatus 100 at a power penetration point, according to the embodiments as described herein. In the embodiment, the power information collecting unit 110 can be configured to measure a power signal (Step S112). Unprocessed power information waveforms of the current and the voltage are measured through the energy measuring apparatus 100 installed at the power penetration point and the single sensor.

Further, the power information collecting unit 110 can be configured to extract snapshot (Step S114). A voltage or current snapshot of an AC waveform having a predetermined cycle is collected. In the embodiment, snapshots of voltage having one AC cycle waveform and high-frequency current are preferably extracted.

Figure 2B:
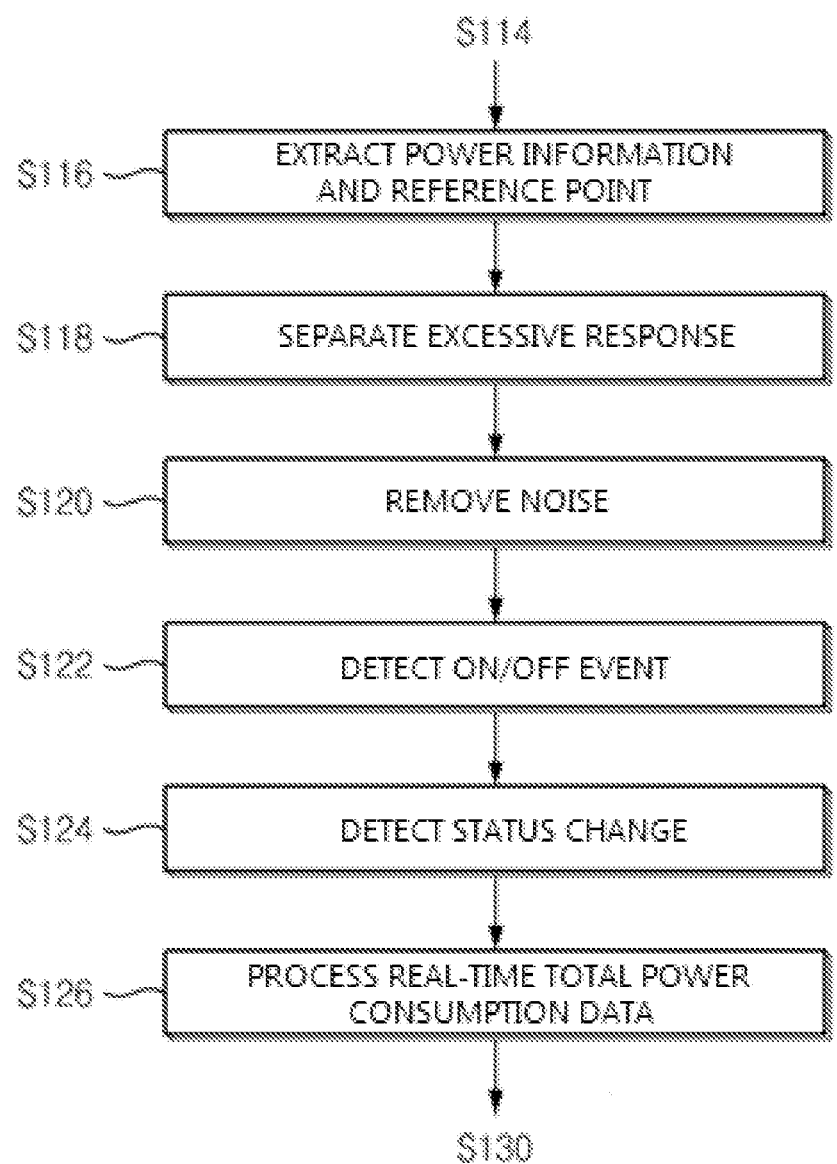

FIG. 2b is a flowchart illustrating various operations performed by the operating status extracting unit 120 of the energy measuring apparatus 100 at a power penetration point, according to the embodiments as described herein. The operating status extracting unit 120 can be configured to distinguish between a normal or excessive status of a power change from the collected voltage or power information to extract an operating status or a change pattern of the operating status of the load apparatus.

Referring to the FIG. 2b, the operating status extracting unit 120 can be configured to extract power information and reference point (Step S116). In an embodiment, real-time power consumption and power quality information are extracted, and the reference point for distinguishing the normal or excessive status is extracted.

In the embodiment, the reference point is preferably power consumption which is constantly used without fluctuation while being not turned on or off and continuously turned on in each of the load apparatuses through the extraction of the real-time power consumption and power quality information.

Further, the operating status extracting unit 120 can be configured to separate an excessive response (Step S118). In an embodiment, an excessive status interval is extracted, in which turn-on or off is performed or the operating status is changed by operations of the individual load apparatuses in the power consumption.

Furthermore, in an embodiment, the operating status extracting unit 120 can be configured to remove a noise (Step S120). A meaningless high-frequency noise signal generated in power signal measurement of total power consumption is removed.

Furthermore, the operating status extracting unit 120 can be configured to classify the snapshot according to the extracted operating status or change pattern of the operating status. For example, in the case of being determined as the excessive response operation, the snapshot may have an even higher snapshot extraction frequency than the normal status.

Furthermore, the operating status extracting unit 120 can be configured to detect an on or off event (Step S122). In an embodiment, the snapshots for events are classified for each on or off status before clustering each of the individual load apparatuses through detection of the on or off event. The operating status extracting unit 120 can be configured to detect status change (Step S124). Multi-steps other than the on or off operation are provided. The change patterns of the operating statuses of loads which have a continuous change characteristic are detected and classified.

After detecting the status change, the operating status extracting unit 120 can be configured to process real-time total power consumption data (Step S126). In an embodiment, the power information data is operated and stored, and a transmission data packet is generated with respect to total energy consumption and the power quality information for a real-time power consumption service.

Figure 2C:
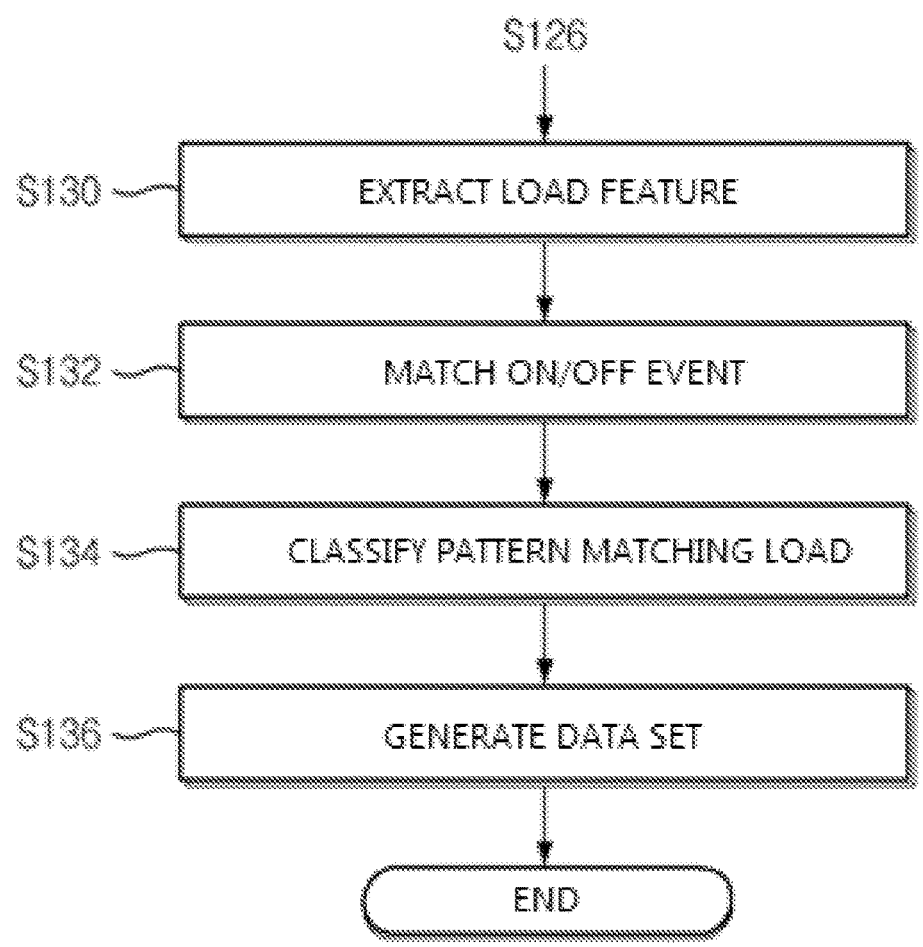

FIG. 2c is a flowchart illustrating various operations performed by the data set generating unit 130 of the energy measuring apparatus 100 at a power penetration point, according to the embodiments as described herein. The data set generating unit 130 can be configured to generate a data set for each of the individual load apparatuses which matches the operating status or the change pattern of the operating status through a signal correlation depending on power usage information of the individual load apparatuses.

Referring to the FIG. 2c, the data set generating unit 130 extracts load features (Step S130). In the embodiment, a signal correlation on which the power usage features of the individual load apparatuses are reflected is generated by using the snapshot, the excessive response, the on or off event, and the status change information extracted from the total power consumption data. The signal correlation can include the voltage or current correlation, the high-frequency distortion, the current or power signal deformation, the active or reactive power correlation, or the like.

Further, the data set generating unit 130 can be configured to match the on or off event (Step S132) and classify pattern matching load (Step S134) to generate the data set. The on or off operation events for the individual load apparatuses are classified in a pair of the same load apparatuses based on the generated signal correlation. The multi-steps or continuous change characteristics are classified into an association group with the on or off operation events with respect to the same load apparatus based on the generated signal correlation.

Furthermore, the data set generating unit 130 can be configured to generate a data set (Step S136). The data sets collected by the association group are generated through the on or off event matching and the pattern matching load classification.

When the data sets are generated, the transmitting unit 140 can be configured to transmit the generated data sets to the energy measurement information labeling server 200 that generates labeled power information by recombining the data sets.

Prior to the transmission, in the embodiment, the data packet generated by the energy measuring apparatus 100 is compressed to facilitate transmission of the massive data to the energy measurement information labeling server 200.

Further, the power consumption and the quality information data required to perform a real-time power energy information service can be together transmitted.

Figure 3:
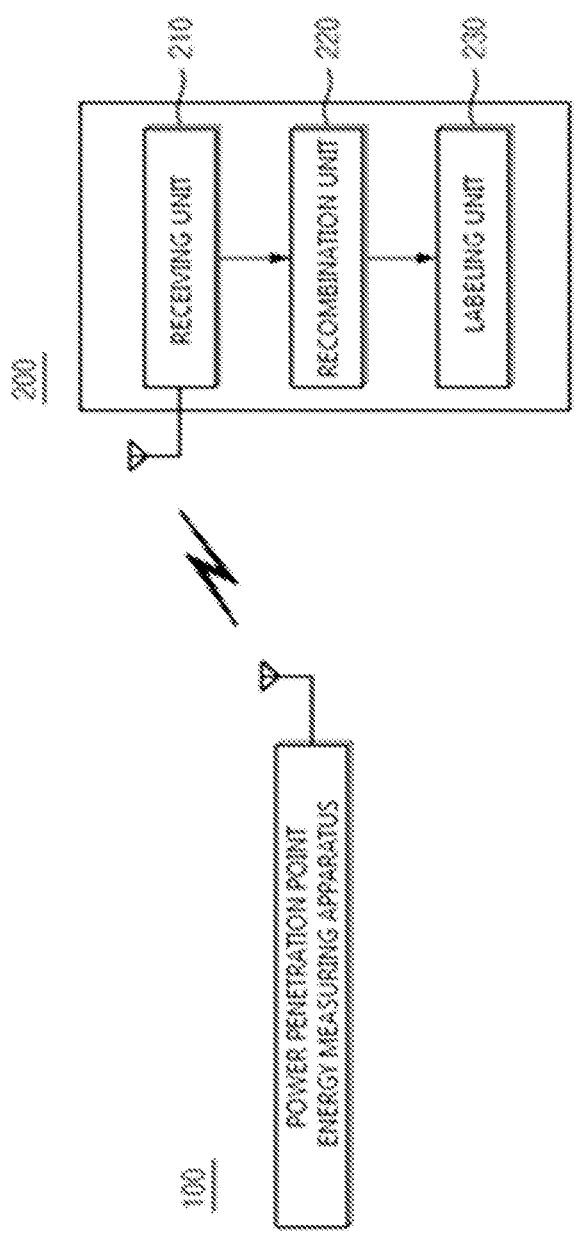
FIG. 3 is a block diagram illustrating an energy measurement information labeling server, according to the embodiments as described herein.

The details of the energy measurement information labeling server 200 that generates the labeled power information by receiving the data sets generated by the power penetration point energy measuring apparatus 100 are described in conjunction with the FIG. 3.

The various actions, acts, blocks, steps, or the like of the FIGS. 2a, 2b and 2c may be performed in the order presented, in a different order or simultaneously. Further, in some embodiments, some of the actions, acts, blocks, steps, or the like may be omitted, added, modified, skipped, or the like without departing from scope of the invention.

The FIG. 3 is a block diagram illustrating the energy measurement information labeling server 200, according to the embodiments as described herein. In an embodiment, the energy measurement information labeling server 200 can be configured to process the energy usage information and saving tip consulting for a power user at the power penetration point through processes such as machine running and automatic labeling based on the received clustering data set and real-time power consumption, and power quality information data set. The energy measurement information labeling server 200 may be a mass data processing device that processes the total energy information and energy information for each of the individual load apparatuses to generate various energy saving solutions.

In an embodiment, the energy measurement information labeling server 200 can be configured to process specific post information through the various computer operations. The process reclassifies the unregistered load clustering data set into multi-dimensional planes based on the reference area, such as the active power, the reactive power, the time, or the like. The process sets a classification boundary surface in the same load apparatus through the machine running to distinguish the unregistered load clustering set for each specific operation or component such as on or off, multi-steps, continuous change, always-activation, or the like.

The distinguished data sets are mapped to the real-time power consumption change to complete the distinguishment and the lower components of the individual load apparatuses are grouped into the same load apparatus which may be recognized by the user (1+2+3 or A+B+C). Further, the registered data sets (refrigerator, washing machine, air-conditioner, or the like) of the individual load apparatuses are matched which have been already stored to be automatically labeled.

In this case, the load apparatuses which are not automatically labeled due to data which are present in the registered data sets are manually labeled through a means of checking the corresponding time by manually turning on or off the load apparatuses which are not automatically labeled. In addition, the manually generated data are added to the pre-collected data set again and then used for the automatic labeling. Further, the various components of the energy measurement information labeling server 200 and operations thereof are described in conjunction with the FIG. 3.

Referring to the FIG. 3, in an embodiment, the energy measurement information labeling server 200 can include a receiving unit 210, a recombination unit 220, and a labeling unit 230.

The receiving unit 210 can be configured to receive a data set generated by classifying power information based on individual load apparatuses. The recombination unit 220 can be configured to reclassify the received data set on a multidimensional plane according to operating characteristics of the individual load apparatuses. Further, the recombination unit 220 can be configured to map and recombine the reclassified data set according to a time domain.

Prior to this, the recombination unit 220 can be configured to decompress data (Step S202). When the energy measuring apparatus 100 transmits the compressed data, the energy measuring apparatus 100 can cancel the data compression in order to increase the execution speed.

When the compression is cancelled, the recombination unit 220 can be configured to map the reclassified data to a power consumption change in the time domain to recombine components in the same load apparatus. The various operations performed by the recombination unit 220 are described in detail in conjunction with the FIG. 4.

The FIG. 3 illustrates a limited overview of the energy measurement information labeling server 200 but, it is to be understood that other embodiments are not limited thereto. The labels provided to each unit or component is only for illustrative purpose and does not limit the scope of the invention. Further, the one or more components can be combined or separated to perform the similar or substantially similar functionalities without departing from the scope of the invention. Furthermore, the energy measurement information labeling server 200 can include various other components interacting locally or remotely along with other hardware or software components to label the extracted energy usage information of a plurality of load apparatus connected to a power penetration point. For example, the component can be, but is not limited to, a process running in the controller or processor, an object, an executable process, a thread of execution, a program, or a computer.

Figure 4:
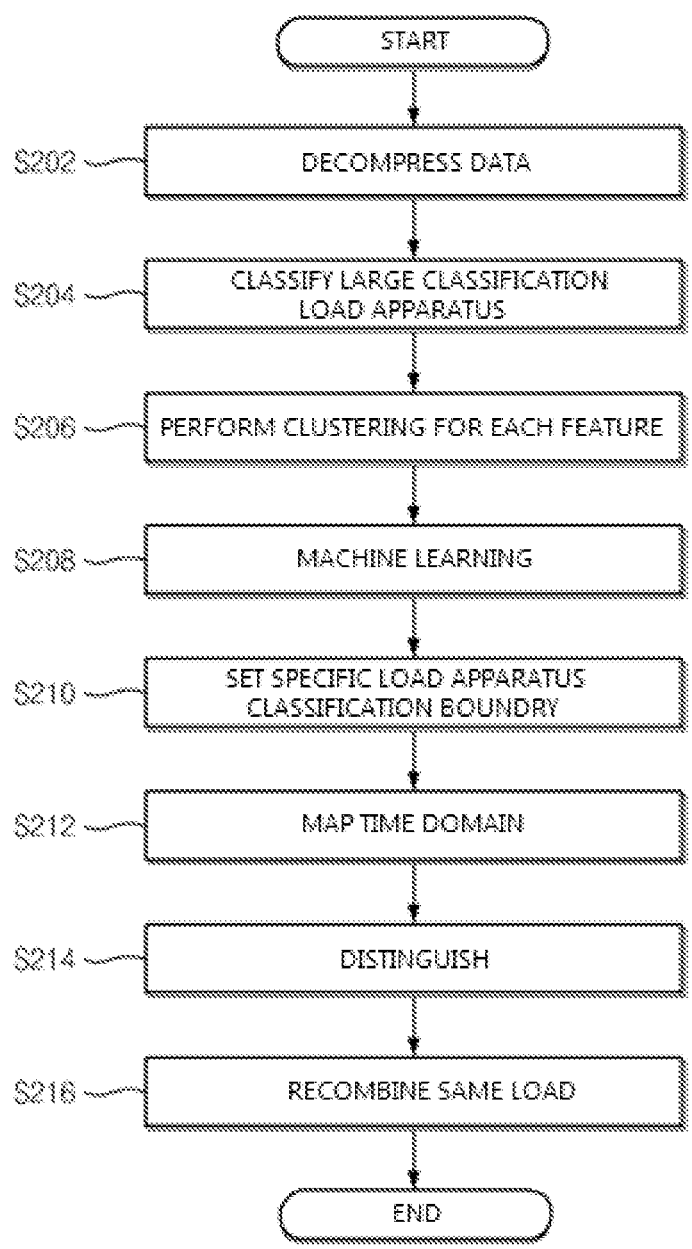
FIG. 4 is a flowchart illustrating various operations performed by the energy measurement information labeling server, according to the embodiments as described herein.

FIG. 4 is a flowchart illustrating various operations performed by the energy measurement information labeling server 200, according to the embodiments as described herein. In an embodiment, the recombination unit 220 can be configured to classify large classification load apparatus (Step S204). A distribution plane is distinguished according to load operating characteristics (on or off, multi-steps, a continuous change, and always activation) for the individual load apparatuses determined as the same energy load apparatus.

Further, the recombination unit 220 can be configured to perform clustering of features (Step S206). The multi-dimensional plane is reconfigured so as to facilitate setting a boundary in the distribution plane by interlocking a clustering data set. In an embodiment, the active power, the reactive power, a time, or the like can be reference areas in reconfiguring the multi-dimensional plane.

When the multi-dimensional plane is reconfigured, the recombination unit 220 can be configured to perform machine learning (Step S208). The operations of the individual load apparatuses or an inter-component boundary classification reference is generated by using a clustering result for each load apparatus and a machine running method based on a status distinguishment technique such as an artificial intelligence network. In addition, the recombination unit 220 can be configured to set specific load apparatus classification boundary (Step S210). Data are reclassified by performing load distinguishment at an individual component level for clustering data by using the machine running boundary classification reference. In this case, unregistered-scheme detailed load classification is determined up to component levels for the individual load apparatuses from a total electric energy.

Further, the recombination unit 220 can be configured to map time domain (Step S212). The data sets for unregistered components reclassified in the process are mapped to real-time data in the time domain. The recombination unit 220 can be configured to distinguish the mapped data (Step S214). The mapped data are distinguished at the component level by various colors or a display method which may be recognized by the user.

Furthermore, the recombination unit 220 can be configured to recombine the same load (Step S216). A group is generated with the load apparatus which may be recognized by the user by combining sub components in the individual load apparatuses generated in the distinguishing step. As one example, compressor, motor, lamp, and control circuit characteristics, generated in the distinguishing step, are combined to be grouped into a refrigerator.

After the recombination step, the labeling unit 230 can be configured to label the recombined data set. For example, a name of a corresponding load apparatus automatically matches unregistered temporary mark data classified as the individual load apparatuses in association with a prestored load apparatus data set. As one example, the A, B, C, or the like may be automatically registered as a refrigerator, a television, a washing machine, or the like through a data pattern and a matching technique with storage data.

Further, in the embodiment, labeling may be manually received. In spite of execution of automatic labeling, a developer or the user manually names apparatuses with respect to loads which are unregistered due to mismatching with prestored load apparatus data and inputs the names. A method that uses an on or off time of the apparatus is also available.

Further, corresponding data is separately stored together with registration with respect to the individual load apparatuses in which the manual labeling is performed to extend a prestored load apparatus data set.

Furthermore, the energy measurement information labeling server 200 may provide data analysis information using energy usage information of the individual load apparatuses. The data analysis based on a behavioristic psychology analysis technique may be applied to total power and energy usage patterns of the individual load apparatuses to generate a specific data set.

Further, a specialist consulting tip to induce energy saving of the user may be automatically generated through the data analysis.

Moreover, an integrated service is available, which provides the total electric energy, usages of the individual load apparatuses, energy saving consulting, or the like to a specific building and a unit household through an energy IT special provider.

Example of various energy saving consulting can be, when a change of the clustering data set distinguished at the component level is sensed in association with the statuses of the individual load apparatuses to determine component aging statuses or failure statuses of the individual load apparatuses, to provide the determined component aging statuses or failure statuses to the user.

According to the embodiments, the hardware of the meter and the software techniques of the server are combined to extract energy usage information of individual components of various load apparatuses from total energy usage information at the power penetration point.

Further, since the software technique of the server is flexibly combined with the single energy measuring apparatus, detailed and accurate energy usage information of the individual load apparatuses is extracted without large cost for system installation through multiple apparatuses to derive a high-end energy saving scheme. In particular, it is possible to acquire energy usage information higher than a branch circuit level without adopting multiple sensors in the distribution board.

In summary, in the present invention, in extracting the energy usage information of the individual load apparatuses in the total electric energy consumption measured at the power penetration point, a specific server does not perform all techniques. Unlike the conventional mechanisms, the previous information processing is performed so as to have resolution which may be distinguished for each component in the single energy measuring apparatus and the server concentratively performs data storage, pattern analysis, and data utilization as an advantage thereof to secure flexibility in energy usage associated mass data processing, storing, or management of various loads.

The various actions, acts, blocks, steps, or the like of the FIG. 4 may be performed in the order presented, in a different order or simultaneously. Further, in some embodiments, some of the actions, acts, blocks, steps, or the like may be omitted, added, modified, skipped, or the like without departing from scope of the invention.

The embodiments disclosed herein can be implemented through at least one software program running on at least one hardware device and performing network management functions to control the elements. The FIGS. 1 to 6 include blocks which can be at least one of a hardware device or a combination of hardware device and software component.

The foregoing description of the specific embodiments will so fully reveal the general nature of the embodiments herein that others can, by applying current knowledge, readily modify or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the technical spirit and scope of the embodiments as described herein.

What is claimed is:

1. An energy measurement information labeling server, the energy measurement information labeling server comprising:
    a receiving unit configured to receive a data set by classifying power information based on component units constituting individual load apparatuses;
    a recombination unit configured to: reclassify said data set according to operating characteristics of said individual load apparatuses;
    map said reclassified data set to a power consumption change of a time domain to distinguish said reclassified data set as a data set for each said component units of said individual load apparatuses; and
    recombine said component according to a property of said individual load apparatuses; and
    a labeling unit configured to label said recombined data set according to said individual load apparatuses to provide an energy saving solution including an energy saving tip.

2. The energy measurement information labeling server of claim 1, wherein said energy measurement information labeling server is configured to sense a change of said data set through a result distinguished as said data set for each said components of said individual load apparatuses to determine status of said individual load apparatuses.

3. An energy measurement information labeling system, the energy measurement information labeling system comprising:
    an energy measuring apparatus configured to:
    collect power information including a power signal, at at least one power penetration point, for a plurality of load apparatuses; and
    generate and transmit a data set for each said load apparatus which matches one of an operating status and a change pattern of operating status of each said load apparatus through a signal correlation depending on power usage features of the individual load apparatuses; and
    a power information labeling server configured to:
    receive said data set;
    reclassify said data set according to the operating characteristics of each said load apparatuses;
    map and recombine said data set according to a time domain; and
    label said recombined data set according to said individual load apparatuses to provide an energy saving solution including an energy saving tip.

4. The energy measurement information labeling system of claim 3, wherein said power information labeling server is configured to sense a change of said data set through a result distinguished as said data set for each component of each said load apparatus to determine status of each said load apparatus.

5. A method for labeling energy information by an energy measurement information labeling server, the method comprising:
- receiving a data set by classifying power information based on component units constituting individual load apparatuses;
- reclassifying said data set according to operating characteristics of said individual load apparatuses;
- mapping said reclassified data set to a power consumption change of a time domain to distinguish said reclassified data set as a data set for each said component unit of said individual load apparatuses;
- recombining said reclassified data set according to a property of said individual load apparatuses; and
- labeling said recombined data set according to said individual load apparatuses to provide an energy saving solution including an energy saving tip.

* * * * *